(12) United States Patent
Scholl et al.

(10) Patent No.: US 7,757,203 B2
(45) Date of Patent: Jul. 13, 2010

(54) AUTOMATED PROCESS FLOW IN PRODUCT DEVELOPMENT

(75) Inventors: Juergen Scholl, Bretten (DE); Stephan Toebben, Walldorf (DE); Helga Walter, Walldorf (DE); Ralf Kau, Neckargemuend (DE)

(73) Assignee: SAP AG, Walldorf (DE)

( * ) Notice: Subject to any disclaimer, the term of this patent is extended or adjusted under 35 U.S.C. 154(b) by 1358 days.

(21) Appl. No.: 10/741,123

(22) Filed: Dec. 19, 2003

(65) Prior Publication Data

US 2005/0138060 A1    Jun. 23, 2005

(51) Int. Cl.
*G06F 9/44* (2006.01)

(52) U.S. Cl. .................. 717/102; 717/106; 717/117; 707/102

(58) Field of Classification Search ......... 717/106–119, 717/102; 707/100–104.1
See application file for complete search history.

(56) References Cited

U.S. PATENT DOCUMENTS

| | | | |
|---|---|---|---|
| 6,370,542 B1 * | 4/2002 | Kenyon | 707/103 R |
| 6,834,370 B1 * | 12/2004 | Brandl et al. | 715/201 |
| 6,983,458 B1 * | 1/2006 | Honda | 717/151 |
| 7,051,036 B2 * | 5/2006 | Rosnow et al. | 707/102 |
| 7,080,351 B1 * | 7/2006 | Kirkpatrick et al. | 717/102 |
| 2001/0052108 A1 * | 12/2001 | Bowman-Amuah | 717/1 |
| 2003/0069659 A1 * | 4/2003 | Wada et al. | 700/108 |
| 2003/0070159 A1 * | 4/2003 | Webb | 717/116 |
| 2004/0031014 A1 * | 2/2004 | Baecker et al. | 717/104 |
| 2005/0188351 A1 * | 8/2005 | Hoefler et al. | 717/106 |

OTHER PUBLICATIONS

Automating software specification, design and synthesis for computer aided control system design tools Ranville, S.; Bostic, D.; Toeppe, S.; vol. 1, Oct. 7-13, 2000 pp. 4C3/1-4C312 vol. 1, IEEE.*
Implementing reusable, instrument independent test programs in the factory Neblett, B.; Sep. 16-19, 1996 pp. 206-212, IEEE.*
Experiments in automatic programming for general purposes Reformat, M.; Chai Xinwei; Miller, J.; Nov. 3-5, 2003 pp. 366-373, IEEE.*

* cited by examiner

*Primary Examiner*—Wei Y Zhen
*Assistant Examiner*—Satish Rampuria
(74) *Attorney, Agent, or Firm*—Finnegan, Henderson, Farabow, Garrett & Dunner LLP (57) ABSTRACT

The invention relates to a computer-implemented method, computer program, computer program product, data structure, and computer for providing automated process flow in product development. A structured data object may be defined comprising at least one recipe and at least one defined formula. Trial stages within said product development are also defined as are object types within said data object referring to said trial stages. An instance of said data object is instantiated from said data object definition. A type of said instance is specified from one of said object types. A user may then be provided said recipe and/or said formula according to the specified type.

40 Claims, 5 Drawing Sheets

| Tab-strip: | Visibility on screen | | |
|---|---|---|---|
| | Bench scale trial | Pilot plant trial | Factory trial |
| • Therefore the content of the classification data is configurable.<br>• Trial goal is covered by the SAP classification. | D | D | D |
| Recipe: | | | |
| • Recipe ID (via reference) | E | E | E |
| Quality control: | | | |
| • Stability study | D | D | D |
| • Inspection lots (in-process and post-process control) | D | D | D |
| QM planning | | | |
| • Inspection plan header | E | E | E |
| • Inspection plan operation | E | E | E |
| • Inspection plan characteristics | E | E | E |
| • Stability study | E | E | E |
| Resources: | - | | - |
| • Line (resource) | - | M | - |
| • Assignment of resources to process stage and operations. | - | E | - |
| Scheduling | - | | |
| • Duration of a trial | - | M | E |
| • Requested date and time | - | D | E |
| • Scheduled date + time(planned), execution date + time(done) | - | D | E |
| • Lot size | - | D | E |
| • Process order | - | D | E |
| • Planned order | - | D | - |
| • Batch produced | - | D | E |
| Actual formula | E | D | E |
| Actual process parameters | E | D | E |
| Trial long texts | | | |
| • Multiple long texts (ITF) for configurable purposes (RMS 2.2 long text approach) | E | E | E |
| Document tab | | | |
| • Assignment of documents to a trial | E | E | E |
| Configuration | E | E | E |
| Header: (no tab-strip but header area) | | | |
| • Number | Fixed | Fixed | Fixed |
| • Language-independent trial name, | M | M | M |
| • Trial long text (ITF-format), | E | E | E |
| • Trial status | E | E | E |
| • Trial type | Fixed | Fixed | Fixed |
| Basic data: | | | |
| • Trial group number/trial collection number<br>• Trial group name | Fixed<br>D | Fixed<br>D | Fixed<br>D |
| • Project number and name (inherited from trial group) | D | D | D |
| • Plant | M | M | M |
| • Material (product) | M | M | M |
| • Person responsible | M | M | M |
| • Administrative data: Created by, changed by, created on, changed on<br>• Authorization group | D<br><br>M | D<br><br>M | D<br><br>M |
| Classification: | | | |
| • The SAP classification is used here. | E | E | E |

Fig. 5

AUTOMATED PROCESS FLOW IN PRODUCT DEVELOPMENT

FIELD OF THE INVENTION

The present invention relates to computer-implemented methods, systems, programs and computer program products, and data objects for providing automated process flow in product development, in particular in computer-aided product development.

BACKGROUND

Trial management plays an important role throughout the product development process of product life cycle management. From the early stages of product design and development, to industrialization, it is important to have proper tools to prove product quality, and to evaluate the production process of trials in a consistent way. During the product development process, trials have to be carried out and evaluated. Carrying out trials requires functions as those provided in the execution, and quality management of regular manufacturing, but with a higher flexibility.

Trials based on recipe management (RM) system recipes may be executed without any additional maintenance of master data on a bench scale or pilot plant scale. Factory trials may also be supported. All results of a trial, including in-process, post-process, and further analyses, are recorded and may be evaluated. A trial object may then deliver a recipe, including key manufacturing instructions, and additional information concerning manufacturing and quality management.

However, to allow efficient product development, the trials within the different stages of development—bench scale, pilot plant scale, and factory scale—need to be supported by a sufficient data structure. Functions need to be provided allowing maintenance of specifications and recipes.

A trial is an action for testing a product in order to achieve the required product quality/specification. During pilot plant phases, a trial allows finding product specifications for a product on a defined product line at optimal cost. More specifically, a trial is the manufacture of a product by using a recipe. A recipe may consist of formula, processing conditions, quality inspection parameters, in-process control, and equipment specification. Not all of these parameters are required. A recipe also allows the subsequent evaluation of all trial results. The trial may be carried out on a bench scale, pilot plant scale, or industrial scale.

A document providing information for product development on a pilot plant scale and an industrial scale might be a preliminary manufacturing dossier (PMD). This PMD describes a production situation in a factory. Such a document may be required for any production start up of a new product.

A PMD template may comprise material specifications, ingredients, and packaging materials, recipes comprising formulae, manufacturing instructions, process block diagrams, in-process controls, and equipment specifications. Furthermore, a finished product specification with all quality management data required for a post-process control, and product release may be included. In addition, label declaration, transport, and storage information may be included.

However, during trials different specifications, recipes, and equipment specifications are necessary for different stages. With known methods, it is not possible to recycle data, which have already been acquired during previous stages. For each stage, the relevant information has to be manually copied. Also, process flow is not supported. Furthermore, users are not provided with a data structure that guides them through the different stages of a product development process.

For different stages within a development process, different actions, recipes, formulae and equipment specifications are necessary. Users have to manually select these to provide trial results for later trial evaluation. This manual selection is error prone.

SUMMARY

To overcome these drawbacks and to provide a user-friendly, flawless, and process flow supporting product development, the invention proposes a computer-implemented method for providing automated process flow in product development, in particular in computer-aided product development, with the steps of defining a structured data object, whereby within said structured data object at least one recipe, and at least one formula is defined, defining trial stages within said product development, defining object types within said data object referring to said trial stages, instantiating an instance of said data object from said data object definition, specifying a type of said instance from one of said object types, and providing said recipe and/or said formula to a user according to the specified type.

A data structure is provided, comprising at least one recipe and at least one formula. This data structure may define a trial object, which handles the life cycle of the trial and links different objects to this trial object. Functions and processes of different stages within product development are simplified so that they can be performed easily by users, which have very different, and non-repetitive tasks.

As during product development, different stages are necessary. These stages are defined and object types referring to said stages are defined within said structured data object. Within the data object, different types are defined, each type referring to a different trial stage.

With this structured data object, it is possible to create an instance of a data object with all properties of the object model. When selecting one of the defined trial stage types within an instance, the instance of the data object may be assigned to a certain type of trial stage.

According to the invention, said recipes and formulae within the data object may be assigned to certain stage types. After selecting and assigning a stage type to an instance of said object, the respective recipes and formulae may become accessible. Recipes and formulae which are not assigned to the respective stage may be hidden from user access.

In this way, the user may be provided with the appropriate information for carrying out the respective trial stage. Information not necessary for the respective stage may be hidden from user view.

A user interface may be provided for trial objects. This user interface may have a header block and multiple tab strips for the single stages of the trial. Depending on the trial type, single tab strips or individual fields on the screen may be hidden, may be editable, or might be mandatory. The user will be guided through the development process using the inventive method. Only relevant data needs to be recorded and presented to the user.

In embodiments consistent with the present invention, trial stages may be defined for laboratory tests, pilot production tests, and/or factory production tests or other stages within product development. Further stages may be included and configured by users. For each of these stages, different recipes and formulae as well as different manufacturing instructions, in-process controls and equipment specifications may be necessary. The specifications are assigned to respective stages.

This means that, for example, different equipment specifications may be available for different stages. According to the selected type within an object, the appropriate specification may be selected and presented to a user. Users may record trial results with respect to the appropriate stage.

During the different stages, a trial may have different states. For each trial stage, different tasks and sub-tasks may have to be accomplished. These tasks and sub-tasks may also be defined within the structured object data definition. Corresponding to the selected type of the object, the different stages together with their respective tasks and sub-tasks may be presented to a user.

Different states of a trial stage may be, for example, trial planning, trial execution, move to production, material management, and/or quality management. These states define which actions (tasks, sub-tasks) may need to be carried out to accomplish a trial stage.

To guide a user through a trial, it is proposed that said recipe comprises process flow instructions which are assigned to objects types and which define a succession of object states. When carrying out a trial, different tasks and sub-tasks to be carried out. Rules may define which tasks have to be accomplished to process the object to a next state. Also, it may be defined which states are required to finish a stage and to move to a next object stage. Therefore, by providing the rules, a process flow may be applied. A user may be guided through the development process by said rules.

To allow guidance of a user through the development process, it is also proposed that said stages are changed according to user selections in a succession provided by said process flow. Once a stage is accomplished, the user may set the state activity to finish. The next stage may be automatically selected according to process flow information.

To allow user inputs of results, and comparison of different trials, it is proposed that process results for respective trial stages are stored within said instance. For that reason, the structured data objects may provide data input fields, which allow the respective process results to be stored. As the user only sees formulae relating to the respective stage and state of the trial, he may edit only these values, which refer to the current process results. Other values do not have to bother the user.

To recycle results of previous trials and to allow transfer of knowledge, it is proposed that for each trial stage a new instance of said data object is created. It is further proposed, that for a new instance of a data objects at least some of the results of a previous stage are copied. By that, it may be possible to recycle object definitions as a new instance of the data object already comprises all object definitions. It is also possible to recycle results from previous stages of a trial, as these may be copied into the new instance of the data object.

To trace all actions and processes carried out for a trial, it is proposed that an object trail is created, which may comprise links to trial objects of a product development process. By this trail, it may be possible to reconstruct which trial objects have been instantiated when, and which were the results of the respective trials. This may be helpful for later comparison of trials and for quality management.

To reconstruct a trial, it is proposed that said object trail comprises information about a succession of different trial objects.

Another aspect of the invention is a computer program for providing automated process flow in product development, in particular in computer-aided product development, operable to cause a processor to define a structured data object, whereby within said structured data object at least one recipe, and at least one formula is defined, define trial stages within said product development, define object types within said data object referring to said trial stages, instantiate an instance of said data object from said data object definition, specify a type of said instance from one of said object types, and provide said recipe and/or said formula to a user according to the specified type.

A further aspect of the invention is a computer program product for providing automated process flow in product development, in particular in computer-aided product development, with a computer program stored thereon operable to cause a processor to define a structured data object, whereby within said structured data object at least one recipe, and at least one formula is defined, define trial stages within said product development, define object types within said data object referring to said trial stages, instantiate an instance of said data object from said data object definition, specify a type of said instance from one of said object types, and provide said recipe and/or said formula to a user according to the specified type.

Yet a further aspect of the invention is a data structure for providing automated process flow in product development, in particular in computer-aided product development, comprising at least one recipe, and at least one formula definition, at least one definition for trial stages within said product development, at least one definition for object types referring to said trial stages, wherein an instance of said data structure specifies a type of trial stage from its definition, and wherein said instance provides said recipe and/or said formula to a user according to the specified type.

Eventually, another aspect of the invention is a computer for providing automated process flow in product development, in particular in computer-aided product development, comprising definition means to define a structured data object, whereby within said structured data object at least one recipe, and at least one formula is defined, to define trial stages within said product development, and to define object types within said data object referring to said trial stages, storage means to store an instance of said data object from said data object definition, computing means to specify a type of said instance from one of said object types, and display means to provide said recipe and/or said formula to a user according to the specified type.

Referring now to the drawings, in which like numerals represent like elements throughout the several figures, aspects of the present invention and the exemplary operating environment will be described.

DETAILED DESCRIPTION

Figure 1:
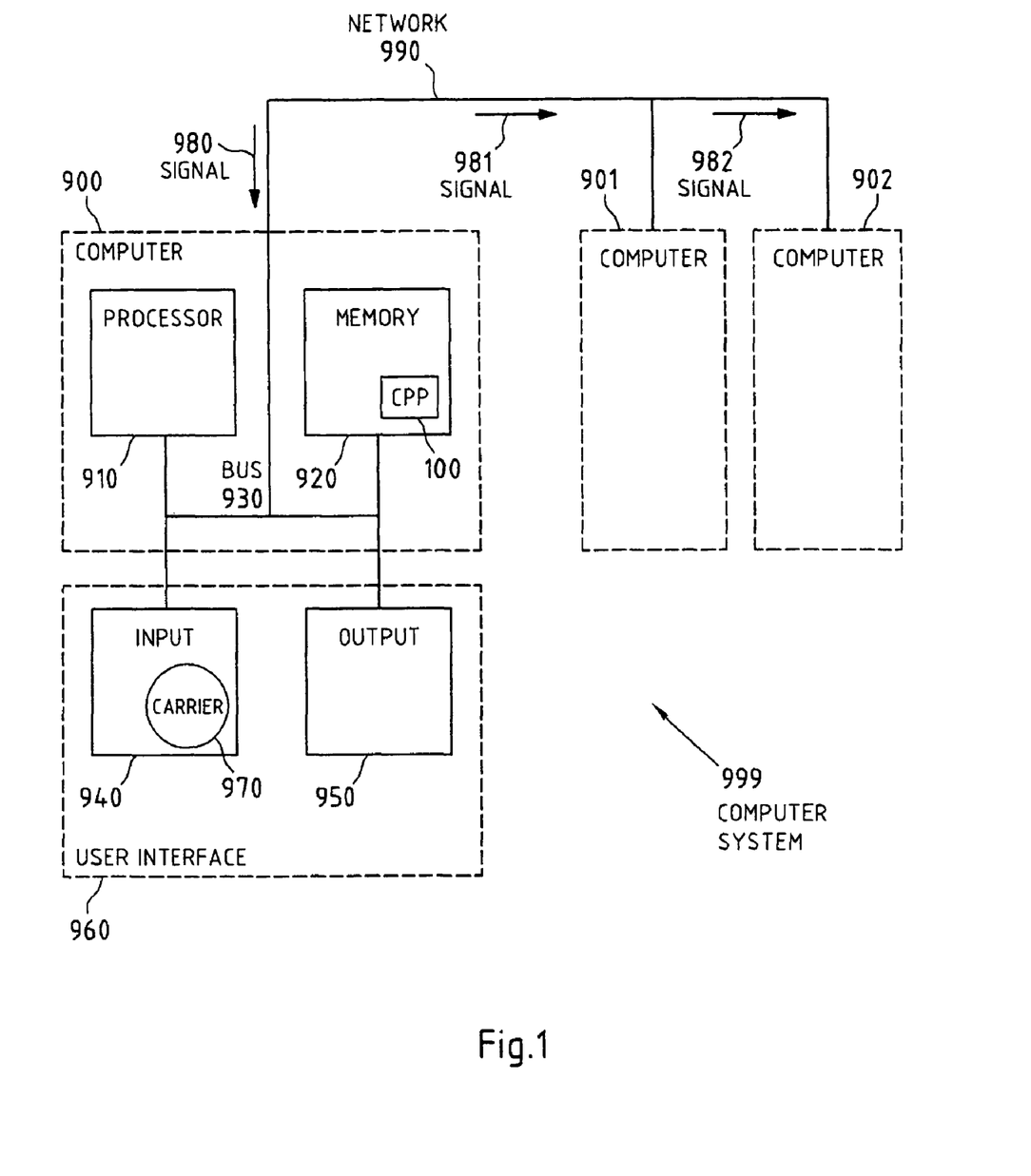
FIG. 1 shows a simplified block diagram of an exemplary computer system.

FIG. 1 illustrates a simplified block diagram of exemplary computer system 999 having a plurality of computers 900, 901, 902 (or even more).

Computer 900 can communicate with computers 901 and 902 over network 990. Computer 900 has processor 910, memory 920, bus 930, and, optionally, input device 940 and output device 950 (I/O devices, user interface 960). As illustrated, the invention may be implemented by computer program product 100 (CPP), carrier 970 and signal 980.

In respect to computer 900, computer 901/902 is sometimes referred to as a "remote computer." Computer 901/902 may be, for example, a server, a peer device or other common network node, and typically has many or all of the elements described relative to computer 900.

Computer 900 may be, for example, a conventional personal computer (PC), a desktop device or a hand-held device, a multiprocessor computer, a pen computer, a microprocessor-based or programmable consumer electronics device, a minicomputer, a mainframe computer, a personal mobile computing device, a mobile phone, a portable or stationary personal computer, a palmtop computer or the like.

Processor 910 may be, for example, a central processing unit (CPU), a micro-controller unit (MCU), digital signal processor (DSP), or the like.

Memory 920 is elements that temporarily or permanently store data and instructions. Although memory 920 is illustrated as part of computer 900, memory can also be implemented in network 990, in computers 901/902 and in processor 910 itself (e.g., cache, register), or elsewhere. Memory 920 can be a read only memory (ROM), a random access memory (RAM), or a memory with other access options. Memory 920 is physically implemented by computer-readable media, for example: (a) magnetic media, like a hard disk, a floppy disk, or other magnetic disk, a tape, a cassette tape; (b) optical media, like optical disk (CD-ROM, digital versatile disk—DVD); (c) semiconductor media, like DRAM, SRAM, EPROM, EEPROM, memory stick.

Optionally, memory 920 is distributed. Portions of memory 920 can be removable or non-removable. For reading from media and for writing in media, computer 900 uses well-known devices, for example, disk drives, or tape drives.

Memory 920 may store modules such as, for example, a basic input output system (BIOS), an operating system (OS), a program library, a compiler, an interpreter, and a text-processing tool. Such modules are commercially available and can be installed on computer 900. For simplicity, these modules are not illustrated.

CPP 100 has program instructions and—optionally—data that cause processor 910 to execute method steps of the present invention. In other words, CPP 100 can control the operation of computer 900 and its interaction in network system 999 so that is operates to perform in accordance with the invention. For example, and without the intention to be limiting, CPP 100 can be available as source code in any programming language, and as object code ("binary code") in a compiled form.

Although CPP 100 is illustrated as being stored in memory 920, CPP 100 can be located elsewhere. CPP 100 can also be embodied in carrier 970.

Carrier 970 is illustrated outside computer 900. For communicating CPP 100 to computer 900, carrier 970 is conveniently inserted into input device 940. Carrier 970 is implemented as any computer-readable medium, such as a medium largely explained above (cf. memory 920). Generally, carrier 970 is an article of manufacture having a computer-readable medium with computer-readable program code to cause the computer to perform methods of the present invention. Further, signal 980 can also embody computer program product 100.

Having described CPP 100, carrier 970, and signal 980 in connection with computer 900 is convenient. Optionally, further carriers and further signals embody computer program products (CPP) to be executed by further processors in computers 901 and 902.

Input device 940 provides data and instructions for processing by computer 900. Device 940 can be a keyboard, a pointing device (e.g., mouse, trackball, cursor direction keys), microphone, joystick, game pad, scanner, or disc drive. Although the examples are devices with human interaction, device 940 can also be a device without human interaction, for example, a wireless receiver (e.g., with satellite dish or terrestrial antenna), a sensor (e.g., a thermometer), a counter (e.g., a goods counter in a factory). Input device 940 can serve to read carrier 970.

Output device 950 presents instructions and data that have been processed. For example, this can be a monitor or a display, (cathode ray tube (CRT), flat panel display, liquid crystal display (LCD), speaker, printer, plotter, vibration alert device. Output device 950 can communicate with the user, but it can also communicate with further computers.

Input device 940 and output device 950 can be combined to a single device. Devices 940 and 950 are also optional.

Bus 930 and network 990 provide logical and physical connections by conveying instruction and data signals. While connections inside computer 900 are conveniently referred to as "bus 930", connections between computers 900-902 are referred to as "network 990". Optionally, network 990 includes gateways which are computers that specialize in data transmission and protocol conversion.

Devices 940 and 950 are coupled to computer 900 by bus 930 (as illustrated) or by network 990 (optional). While the signals inside computer 900 are mostly electrical signals, the signals in the network may be electrical, electromagnetic, optical or wireless (radio) signals.

Networks are commonplace in offices, enterprise-wide computer networks, intranets and the Internet (e.g., world wide web WWW). Network 990 can be a wired or a wireless network. To name a few network implementations, network 990 can be, for example, a local area network (LAN), a wide area network (WAN), a public switched telephone network (PSTN); a Integrated Services Digital Network (ISDN), an infra-red (IR) link, a radio link, like Universal Mobile Telecommunications System (UMTS), Global System for Mobile Communication (GSM), Code Division Multiple Access (CDMA), or satellite link.

A variety of transmission protocols, data formats and conventions is known, for example, as transmission control protocol/internet protocol (TCP/IP), hypertext transfer protocol (HTTP), secure HTTP, wireless application protocol (WAP), unique resource locator (URL), a unique resource identifier (URI), hypertext markup language (HTML), extensible markup language (XML), extensible hypertext markup language (XHTML), wireless markup language (WML), Standard Generalized Markup Language (SGML).

Interfaces coupled between the elements are also well known in the art. For simplicity, such interfaces are not illustrated. An interface can be, for example, a serial port interface, a parallel port interface, a game port, a universal serial bus (USB) interface, an internal or external modem, a video adapter, or a sound card.

A computer and the computer programs operating thereupon are closely related. As used hereinafter, phrases, such as "the computer provides" and "the program provides", are convenient abbreviations to express actions by a computer that is controlled by a program.

Figure 2:
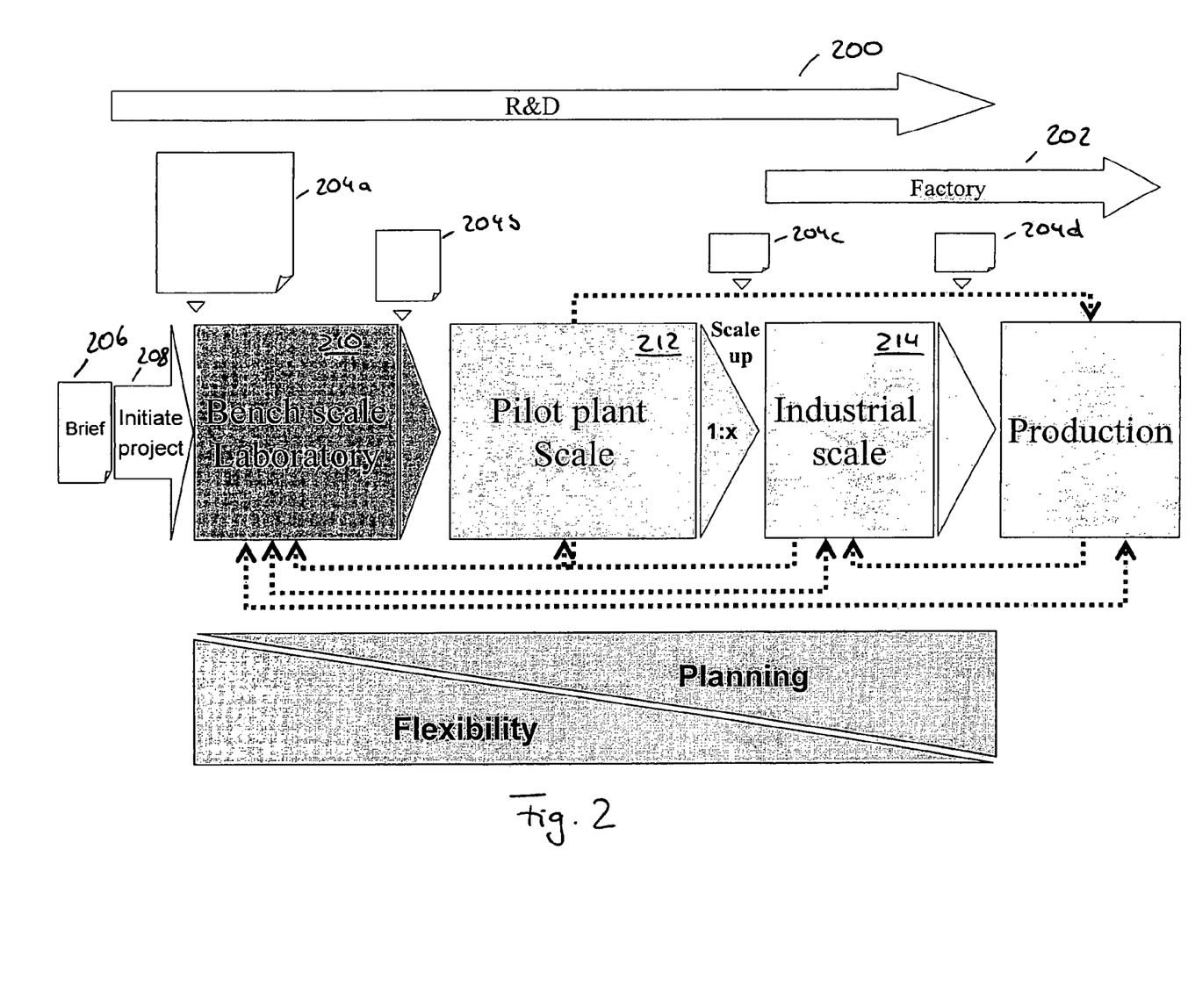
FIG. 2 shows an overview of an exemplary product development process.

FIG. 2 depicts an overview of a product development process. During research and development (200) and factory trials (202) a business process object 204 may run through different stages.

After a new trial has been planned upon a request for product innovation or renovation, the research and development department responsible for that product group may consolidate all information into a brief using a predefined "brief template" (206). A project for the product request is started (208).

Upon starting, a structured data object 204 may be defined (204a). Within this structured data object, material specifications, such as ingredients and packaging material, recipes comprising formula, manufacturing instructions, process block diagrams, in-process control and equipment specifications may be defined. In some embodiments, finished product specifications may also be defined. These specifications may comprise quality management data required for post-process control and product release, label declaration, storage test results, transport, and storage information. Structured data definition 204 may comprise for various trial stages different definitions for at least recipe and formula.

The various stages of a product development process are recipe design on bench scale with a focus on the formula and its properties (210), recipe design on a pilot plant scale with a focus on process and finished product quality (212) and a transfer of the pilot plant results, and confirmation and approval to industrial scale (214).

Loops between steps 210-214 are possible within a product development process. In some specific cases, a direct transformation can occur as well, depicted by dotted lines.

Structured data object definition 204 may be used to create an instance of the data object 204a. This data object 204a is specified as being of the type of bench scale laboratory (210). This specification defines which recipes, material specifications, and product specifications are accessible for users. During bench scale laboratory (210), trial results may be stored within the instance of data objects 204a. Various instances of the data object 204a may be created, each instance storing results of different trials, e.g. different recipes tested.

After finalizing bench scale trials (210), instances of data objects 204a may be selected, which should serve as basis for pilot plant scale trials (212). From these instances, copies are created, creating new data objects 204b, being specified to have a type of pilot plant scale. Within this data object 204b, recorded values of data objects 204a may be copied. As data object 204b is of the type pilot plant scale, different actions, tasks, recipes and formula may be presented to users. During pilot plant trials (212), new trial results may be created and stored within data object 204b.

After the pilot plant trials (212) are finalized, a new data object 204c may be created. This data object 204c may be an instance of the previously defined structured data object. The data object 204c may be based on data object 204b. Therefore, values stored within data object 204b may be recycled with data object 204c. Data object 204c is specified as being industrial scale trial type.

During industrial scale trials (214) different recipes, tasks, specifications and process flows than during bench scale laboratory trials (210) and pilot plants trials (212) may be presented to the users. Trial results may be recorded, for example, in the data objects 204c.

After finalizing industrial scale trials (214), a new data object 204d may be created. Within this data object 204d, all relevant information resulting from the various trials for production may be stored. In data object 204d, results from bench scale laboratory trials (210), pilot plant scale trials (212), and industrial scale trials (214) may be stored.

As all data objects 204 may be based on the same specifications, object definition work has to be done only once. Users are guided through the process flow of each stage 210-214 by instances of these data objects, whereby these instances are specified as being of a certain type. Thereby, only relevant information of the data object is accessible by and presented to users.

Figure 3:
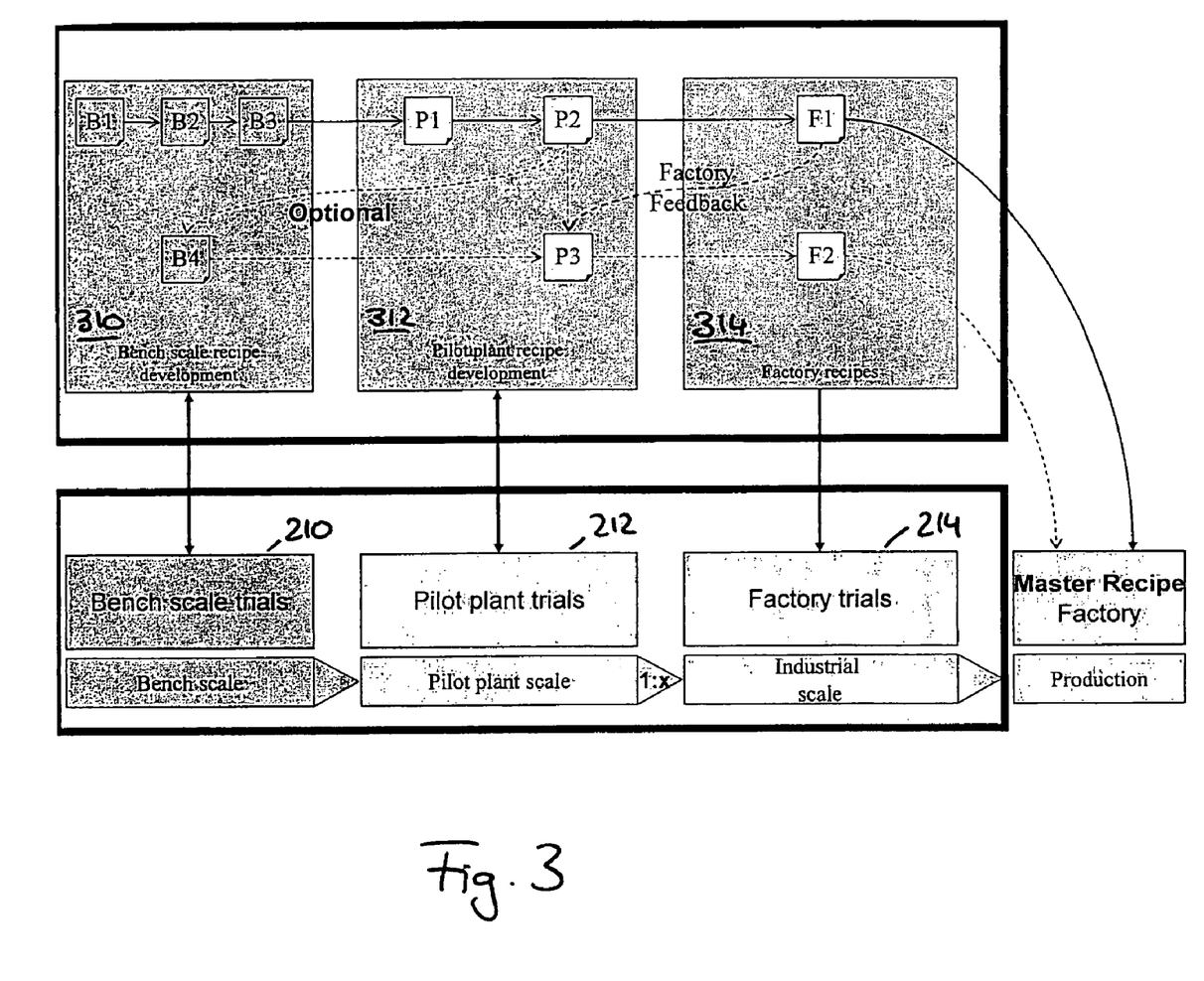
FIG. 3 shows an exemplary recipe development process with trial support.

FIG. 3 depicts a recipe development process. During the different stages 210-214 of a product development process, different recipes for a product may be tested.

All these recipes may be taken from instances of data objects, which are based on a data object definition.

For a new product, an initial recipe B1 may be designed in the bench scale phase 310. This recipe B1 may be focused on its formula and may be based on brief requirements. During the trial, different recipe drafts B2 may be necessary to create a satisfying product with a resulting recipe B3. The bench scale development process may be finalized in case a satisfying recipe B3 is found.

After finalising the bench scale trial 210, a new data object may be created to be used during pilot plant trials 312. Into this newly created data object, the recipe B3 may be copied serving as a basis for the pilot plant trials 212. During pilot plant trials 212, different tasks are to be accomplished as during bench scale trials 210. These tasks may be presented to the user automatically, as the data object is of the type pilot plant trial.

Several iterations of recipe changes, pilot plant trial executions, and analyses may be necessary until a pilot plant recipe P2 is approved for industrial scale. This recipe P2 may be copied into a new data object of the type industrial scale. Within this newly created object, recipe P2 may be adjusted into recipe F1 valid for factoring production. Based on this recipe F1, a preliminary manufacturing document may be created.

During pilot plant trial 312, or during factory trials 314, it may be found that additional pilot plant trials based on recipe P3 or recipe F2 are necessary, in order to find a satisfying product.

Based on the recipe F1 or F2, depending which is the better result, the factory will start producing the new or modified product for commercial use.

A trial trail may be created which records all stages of the data objects throughout the different trial stages 210-214. This allows comparison of different trials and quality management monitoring. Also, the development process may be guided by process flow rules, which are stored within the data objects.

Figure 4:
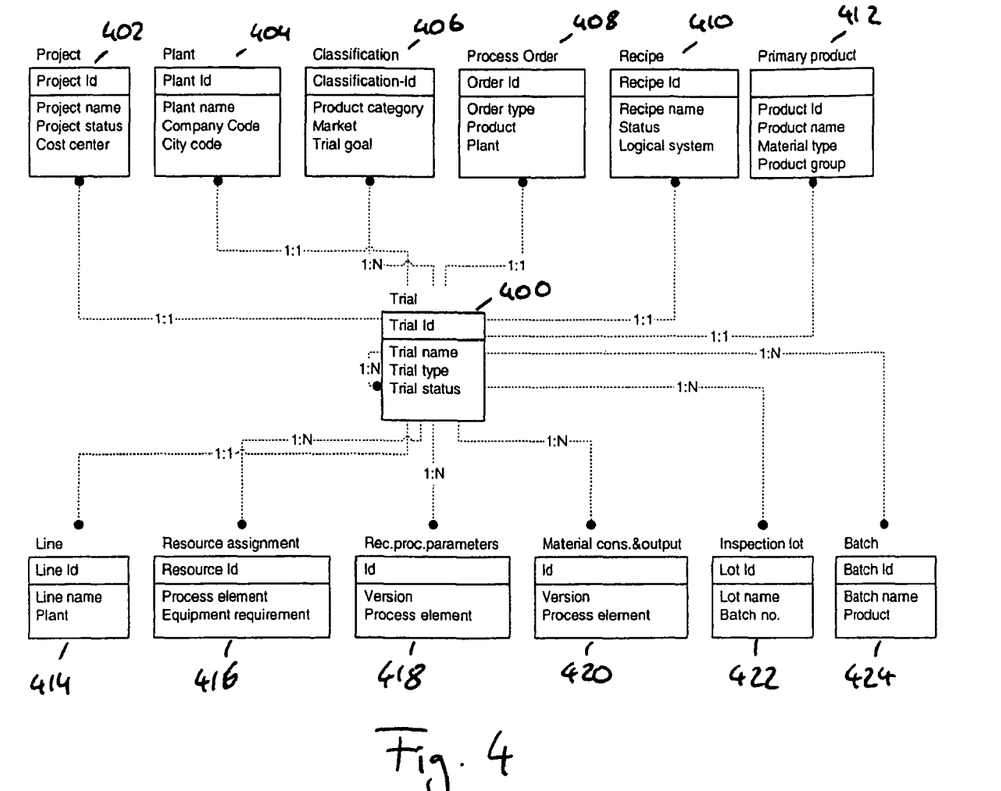
FIG. 4 shows an exemplary data structure consistent with the present invention.

FIG. 4 depicts a data model for an inventive data structure. Each data object has a trial ID object 400. Within the trial ID object 400, trial name, trial type, and trial status definitions may be stored.

For each trial ID object 400, a project object 402, a plant object 404, a process order object 408, a recipe object 410, a primary product object 412, and a line object 414 may be defined. These may comprise information referring to the respective objects. Depending on the trial type, some of these objects may change. Also depending on the trial type, the objects may be accessible to users or locked.

For each trial ID object 400, a plurality of classification objects 406, batch objects 424, inspection lot objects 422, material consolidation and output objects 420, process parameter objects 418 and resource assignment objects 416 may be stored. Within these objects information concerning the respective product may be stored.

A trial may be a central object within trial management. Different trial attributes may be accessible during bench scale trials, pilot plant trials or factory scale trials. The user interface for a trial object provides a header block and multiple tab strips for single parts of a trial. Depending on the trial type, single tab strips or individual fields on the screen may be hidden, editable or mandatory.

Figure 5:
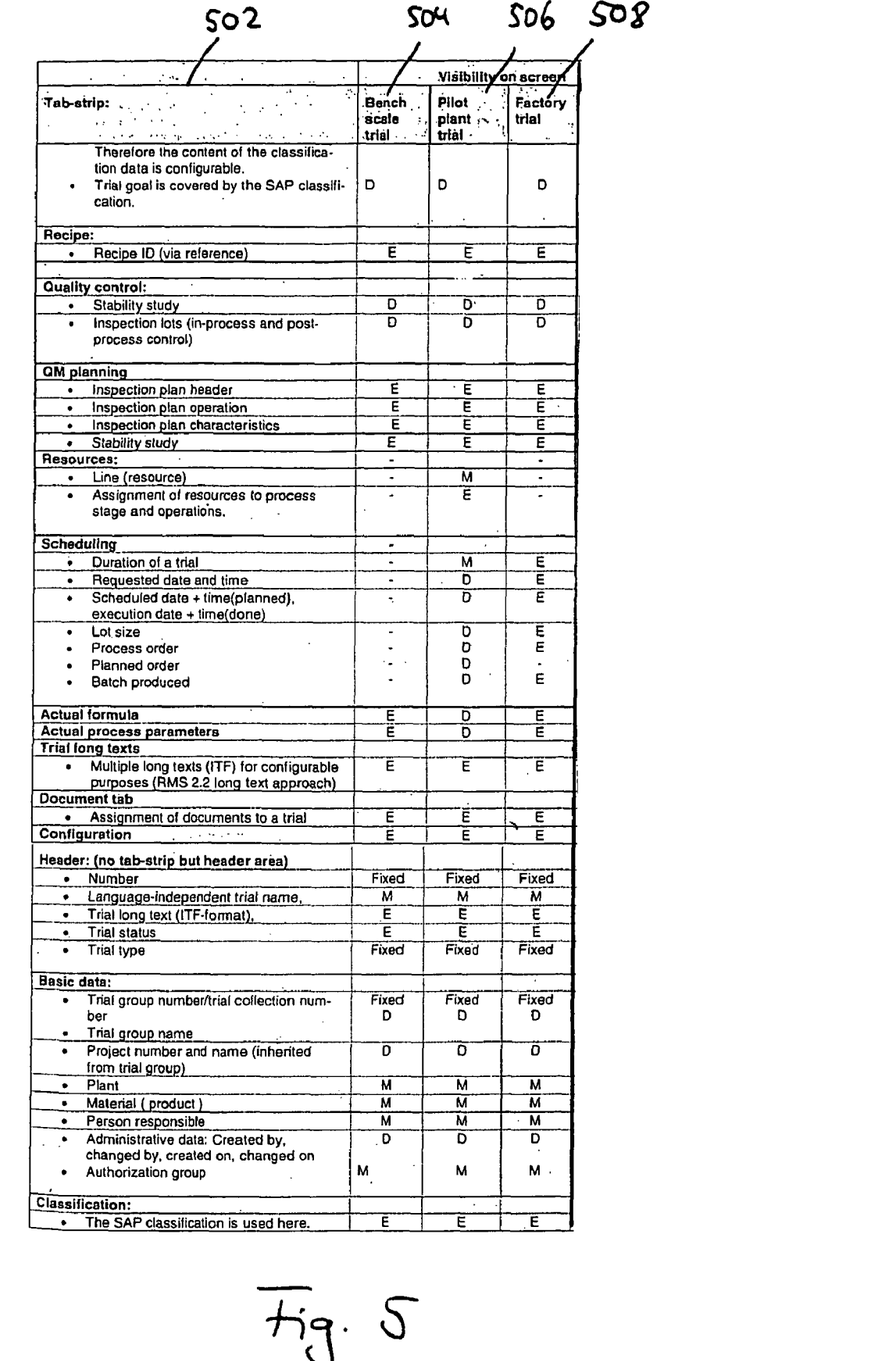
FIG. 5 shows an exemplary assignment of data objects to trial status.

FIG. 5 depicts a table with different parts of a trial object in column 502. For each of these parts, it may be defined whether they are fixed, mandatory, editable, or displayed within the different trial types. For a trial type bench scale trial, column 504 is provided. For a trial type pilot plant trial, column 506 is provided. For a trial type factory trial, column 508 is provided.

Fixed attributes must be entered at the time of the trial creation and cannot be changed afterwards. Mandatory (M) attributes must be entered but may be changed afterwards. Editable (E) attributes are optional, not mandatory, and may be changed. Display only (D) attributes may be shown but may not be editable. Attributes which are not visible are depicted with "-" symbol.

As can be seem from FIG. 5, different objects may have different attributes for different stages of a trial. This allows guiding users through a trial depending on respective trial types.

What is claimed is:

1. A computer-implemented method for providing automated process flow through trial stages in product development using a system comprising a processor and a memory encoded with program instructions, the program instructions when executed by the processor cause the processor to perform, the method comprising:
   defining, using the processor, a structured data object to have object types, at least one recipe, and at least one formula;
   defining said object types to correspond to the trial stages, wherein trial stages are defined for laboratory tests, pilot production tests, and/or factory production tests;
   instantiating an instance of said structured data object, stored in the memory, from said data object definition according to the position of the process flow in the product development, wherein the data object definition provides multiple instances that correspond to the trial stages;
   specifying a type of said instance from one of said object types according to the position of the process flow;
   providing said recipe and/or said formula to a user according to the specified type; and
   directing the user through the trial stages in product development using at least one of the recipe or the formula, wherein said recipe comprises process flow instructions, said process flow instructions assigned to object types, and define a succession of object states.

2. The computer-implemented method of claim 1, wherein said trial stage comprises at least two states.

3. The computer-implemented method of claim 2, wherein said trial stage comprises trial planning, trial execution, move to production, material management, and/or quality management states.

4. The computer-implemented method of claim 1, wherein said states are changed according to user selections in a succession provided by said process flow.

5. The computer-implemented method of claim 1, wherein process results for a respective trial stage are stored within said instance.

6. The computer-implemented method of claim 1, wherein for each trial stage a new instance of said structured data object is created.

7. The computer-implemented method of claim 6, wherein for a new instance of a structured data object at least some of the results of a previous stage are copied.

8. The computer-implemented method of claim 1, wherein an object trail is created, said object trail comprising links to trial objects of a product development process.

9. The computer-implemented method of claim 8, wherein said object trail comprises information about a succession of different trial objects.

10. A computer-implemented method for providing automated process flow through trial stages in product development using a system comprising a processor and a memory encoded with program instructions, the program instructions when executed by the processor cause the processor to perform, the method comprising:
    defining, using the processor, a structured data object to have object types, at least one recipe, and at least one formula;
    defining said object types to correspond to the trial stages, wherein trial stages are defined for laboratory tests, pilot production tests, and/or factory production tests;
    instantiating an instance of said structured data object from said data object, stored in the memory, definition according to the position of the process flow in the product development, wherein the data object definition provides multiple instances that correspond to the trial stages;
    specifying a type of said instance from one of said object types according to the position of the process flow;
    providing said recipe and/or said formula to a user according to the specified type; and
    directing the user through the trial stages in product development using at least one of the recipe or the formula, wherein said recipe comprises process flow instructions, said process flow instructions are assigned to object types, and said process flow instructions define a succession of object states that are changed according to user selections in a succession provided by said process flow.

11. A computer-implemented method for providing automated process flow through trial stages in product development using a system comprising a processor and a memory encoded with program instructions, the program instructions when executed by the processor cause the processor to perform, the method comprising:
    defining, using the processor, a structured data object to have object types, at least one recipe, and at least one formula;
    defining said object types to correspond to the trial stages, wherein trial stages are defined for laboratory tests, pilot production tests, and/or factory production tests;
    instantiating an instance of said structured data object, stored in the memory, from said data object definition according to the position of the process flow in the product development, wherein the data object definition provides multiple instances that correspond to the trial stages;
    specifying a type of said instance from one of said object types according to the position of the process flow;
    providing said recipe and/or said formula to a user according to the specified type;
    directing the user through the trial stages in product development using at least one of the recipe or the formula, wherein said recipe comprises process flow instructions, said process flow instructions assigned to object types, and said process flow instructions define a succession of object states; and creating an object trail, said object trail comprising links to trial objects of a product development process, and information about a succession of different trial objects.

12. A non-transitory computer-readable storage medium storing instructions that, when executed, perform a method for providing automated process flow through trial stages in product development, the method comprising:
defining a structured data object to have object types, at least one recipe, and at least one formula;
defining said object types to correspond to the trial stages, wherein trial stages are defined for laboratory tests, pilot production tests, and/or factory production tests;
instantiating an instance of said structured data object from said data object definition according to the position of the process flow in the product development, wherein the data object definition provides multiple instances that correspond to the trial stages;
specifying a type of said instance from one of said object types according to the position of the process flow;
providing said recipe and/or said formula to a user according to the specified type; and
directing the user through the trial stages in product development using at least one of the recipe or the formula, wherein said recipe comprises process flow instructions, said process flow instructions assigned to object types, and define a succession of object states.

13. The computer-readable storage medium of claim 12, further comprising instructions operable to comprise within said trial stage at least two states.

14. The computer-readable storage medium of claim 13, further comprising instructions operable to comprise within said trial stage trial planning, trial execution, move to production, material management, and/or quality management states.

15. The computer-readable storage medium of claim 12, further comprising instructions operable to change said states according to user selections in a succession provided by said process flow.

16. The computer-readable storage medium of claim 12, further comprising instructions operable to store process results for a respective trial stage within said instance.

17. The computer-readable storage medium of claim 12, further comprising instructions operable to create for each trial stage a new instance of said structured data object.

18. The computer-readable storage medium of claim 17, further comprising instructions operable to copy for a new instance of a structured data object at least some of the results of a previous stage.

19. The computer-readable storage medium of claim 12, further comprising instructions operable to create an object trail, said object trail comprising links to trial objects of a product development process.

20. The computer-readable storage medium of claim 19, further comprising instructions operable to comprise within said object trail information about a succession of different trial objects.

21. A non-transitory computer-readable storage medium storing instructions that, when executed, perform a method for providing automated process flow through trial stages in product development, the method comprising:
defining a structured data object to have object types, at least one recipe, and at least one formula;
defining said object types to correspond to the trial stages, wherein trial stages are defined for laboratory tests, pilot production tests, and/or factory production tests;
instantiating an instance of said structured data object from said data object definition according to the position of the process flow in the product development, wherein the data object definition provides multiple instances that correspond to the trial stages;
specifying a type of said instance from one of said object types according to the position of the process flow; and
providing said recipe and/or said formula to a user according to the specified type; and
directing the user through the trial stages in product development using at least one of the recipe or the formula, wherein said recipe comprises process flow instructions, said process flow instructions assigned to object types, and define a succession of object states that are changed according to user selections in a succession provided by said process flow.

22. The computer-readable storage medium of claim 21, further comprising instructions operable to comprise within said trial stage at least two states.

23. The computer-readable storage medium of claim 22, further comprising instructions operable to comprise within said trial stage trial planning, trial execution, move to production, material management, and/or quality management states.

24. The computer-readable storage medium of claim 21, further comprising instructions operable to store process results for a respective trial stage within said instance.

25. The computer-readable storage medium of claim 21, further comprising instructions operable to create for each trial stage a new instance of said structured data object.

26. The computer-readable storage medium of claim 25, further comprising instructions operable to copy for a new instance of a structured data object at least some of the results of a previous stage.

27. The computer-readable storage medium of claim 21, further comprising instructions operable to create an object trail, said object trail comprising links to trial objects of a product development process.

28. The computer-readable storage medium of claim 27, further comprising instructions operable to comprise within said object trail information about a succession of different trial objects.

29. A non-transitory computer-readable storage medium storing a data structure for providing automated process flow through trial stages in product development, the data structure comprising:
object types;
at least one recipe, and at least one formula definition, wherein at least one of the recipe or the formula is configured to direct the user through the trial stages in product development, wherein said recipe comprises process flow instructions, said process flow instructions are assigned to object types that define a succession of object states;
at least one definition for object types corresponding to trial stages, wherein said trial stages are defined for laboratory tests, pilot production tests, and/or factory tests, wherein at least one of the object types specifies an instance of said data structure according to the position of the process flow in the product development, wherein the data object definition provides multiple instances that correspond to the trial stages; and
wherein said instance provides said recipe and/or said formula to a user according to the specified type.

30. The data structure of the computer-readable storage medium of claim 29, wherein said trial stages are defined to comprise at least two states.

31. The data structure of the computer-readable storage medium of claim 30, wherein said trial stage are defined to comprises trial planning, trial execution, move to production, material management, and/or quality management states.

32. A system for providing automated process flow through trial stages in product development, the system comprising:
a processor configured to:
define a structured data object to have object types, at least one recipe, and at least one formula, and for defining object types to correspond to the trial stages, wherein trial stages are defined for laboratory tests, pilot production tests, and/or factory tests; and
direct the user through the trial stages in product development using at least one of the recipe or the formula, wherein said recipe comprises process flow instructions, said process flow instructions assigned to object types, and define a succession of object states;
a memory for storing an instance of said structured data object from said data object definition according to the position of the process flow in the product development, wherein the data object definition provides multiple instances that correspond to the trial stages, wherein the processor specifies a type of said instance from one of said object types according to the position of the process flow; and
a display for displaying said recipe and/or said formula to a user according to the specified type.

33. The system of claim 32, wherein said processor defines said trial stage to comprise at least two states.

34. The system of claim 33, wherein said processor defines said trial stage to comprise trial planning, trial execution, move to production, material management, and/or quality management states.

35. The system of claim 33, wherein said processor changes said states according to user selections in a succession provided by said process flow.

36. The system of claim 32, wherein said memory stores process results for a respective trial stage within said instance.

37. The system of claim 32, wherein said processor creates for each trial stage a new instance of said structured data object.

38. The system of claim 37, wherein said processor copies for a new instance of a structured data object at least some of the results of a previous stage.

39. The system of claim 32, wherein said processor defines an object trail, said object trail comprising links to trial objects of a product development process.

40. The system of claim 39, wherein said processor computes object trail comprises information about a succession of different trial objects.

* * * * *